United States Patent
Plett

(10) Patent No.: US 10,422,824 B1
(45) Date of Patent: Sep. 24, 2019

(54) SYSTEM AND METHOD FOR EFFICIENT ADAPTIVE JOINT ESTIMATION OF BATTERY CELL STATE-OF-CHARGE, RESISTANCE, AND AVAILABLE ENERGY

(75) Inventor: Gregory L. Plett, Palmer Lake, CO (US)

(73) Assignee: NIKOLA LLC, Denver, CO (US)

( * ) Notice: Subject to any disclaimer, the term of this patent is extended or adjusted under 35 U.S.C. 154(b) by 1170 days.

(21) Appl. No.: 12/660,150

(22) Filed: Feb. 19, 2010

(51) Int. Cl.
| | |
|---|---|
| G01R 31/3842 | (2019.01) |
| G01R 31/36 | (2019.01) |
| H01M 10/48 | (2006.01) |
| H01M 10/0525 | (2010.01) |
| G01R 31/00 | (2006.01) |

(52) U.S. Cl.
CPC .................... G01R 31/00 (2013.01)

(58) Field of Classification Search
CPC ............ G01R 31/3631; G01R 31/3634; G01R 31/3651; G01R 31/362; G01R 31/3624; G01R 31/361; H02J 7/0016; H02J 7/0068; H02J 7/0052; H02J 1/102; H02J 7/0021; H02J 2007/0059; H02M 3/33507
USPC .......................................................... 702/63
See application file for complete search history.

(56) References Cited

U.S. PATENT DOCUMENTS

| | | | | |
|---|---|---|---|---|
| 5,321,627 A | * | 6/1994 | Reher ................. | G01R 31/3648 702/63 |
| 6,534,954 B1 | * | 3/2003 | Plett ..................... | G01R 31/367 320/132 |
| 6,543,954 B2 | * | 4/2003 | Owings ......................... | 401/185 |
| 7,315,789 B2 | * | 1/2008 | Plett .................... | G01R 31/3842 702/63 |
| 8,749,204 B2 | * | 6/2014 | Majima .................. | G01R 31/36 320/149 |
| 2004/0032264 A1 | * | 2/2004 | Schoch .............. | G01R 31/3828 324/426 |
| 2004/0119445 A1 | * | 6/2004 | Wakeman .......... | G01R 31/3835 320/156 |
| 2006/0261782 A1 | * | 11/2006 | Kim et al. ..................... | 320/132 |
| 2007/0046292 A1 | * | 3/2007 | Plett .................... | G01R 31/3835 324/429 |
| 2008/0157777 A1 | * | 7/2008 | Yamabe ............. | G01R 31/3842 324/426 |
| 2009/0134843 A1 | * | 5/2009 | Mizuno ................ | G01R 31/382 320/134 |

(Continued)

*Primary Examiner* — Mohammad K Islam
(74) *Attorney, Agent, or Firm* — Polsinelli PC

(57) ABSTRACT

A system and method for determining an estimated battery cell state-of-charge and for determining an estimated battery cell resistance and for determining an estimated battery cell available energy is provided. The method includes measuring at least one of a battery cell voltage, a battery cell current, and a battery cell temperature. The method further includes determining an adapted estimated polarization voltage vector. The method further includes estimating the battery cell state-of-charge based on the adapted estimated polarization voltage vector and at least one of the battery cell voltage, the battery cell current, and the battery cell temperature. The method can further include computing the estimated battery cell resistance. The method further stores values corresponding to the estimated battery cell state-of-charge and the estimated battery cell resistance and the estimated battery cell available energy in a memory.

12 Claims, 7 Drawing Sheets

(56) References Cited

U.S. PATENT DOCUMENTS

| | | | | |
|---|---|---|---|---|
| 2010/0036627 A1* | 2/2010 | Bergveld | ........... | G01R 31/3835 |
| | | | | 702/63 |
| 2011/0074433 A1* | 3/2011 | Zhang | .................. | G01R 31/396 |
| | | | | 324/429 |
| 2011/0119005 A1* | 5/2011 | Majima | ............... | H01M 10/425 |
| | | | | 702/63 |
| 2011/0156713 A1* | 6/2011 | Akamine | ........... | G01R 31/3828 |
| | | | | 324/433 |

* cited by examiner

SYSTEM AND METHOD FOR EFFICIENT ADAPTIVE JOINT ESTIMATION OF BATTERY CELL STATE-OF-CHARGE, RESISTANCE, AND AVAILABLE ENERGY

BACKGROUND OF THE INVENTION

Batteries are used in a wide variety of electronic and electrical devices. It is desirable to be able to estimate the internal state-of-charge of a battery cell, the resistance of a battery cell, and the residual available energy of a battery cell.

Many algorithms have been proposed for the purpose of battery cell state-of-charge estimation. Very often, there is a tradeoff between the complexity of the algorithm and the accuracy of the results that it produces. Very accurate results tend to be produced only by very complex algorithms, which in turn require significant processor resources to execute. Accurate results at a lower complexity are desirable.

Furthermore, certain applications demand higher accuracy at different operational points. It may not be necessary for very high estimation accuracy when the battery cell is in the mid-range of its capacity. It may be more important to have high estimation accuracy when the battery cell is nearly fully charged or when it is nearly fully discharged.

Accordingly, the inventor herein has recognized a need for an improved method for more efficiently determining an estimated battery cell state-of-charge when the battery cell is either nearly fully charged or nearly fully discharged. Furthermore, the inventor has recognized a need for an associated battery cell resistance estimate and a battery cell available energy estimate.

BRIEF DESCRIPTION OF THE INVENTION

A method for determining an estimated battery cell state-of-charge indicative of a state-of-charge of a battery cell and for determining an estimated resistance indicative of a resistance of a battery cell and for determining an estimated available energy indicative of an available energy of a battery cell in accordance with an exemplary embodiment is provided. The method includes measuring at least one of a battery cell voltage, a battery cell current, and a battery cell temperature. The method further includes determining an adapted estimated polarization voltage vector based on an estimated battery cell state-of-charge at a prior predetermined time and at least one of the battery cell voltage, the battery cell current, and the battery cell temperature. The method further includes determining an estimated battery cell state-of-charge and an estimated battery cell resistance and an estimated battery cell available energy and storing the values corresponding to the estimated battery cell state-of-charge and the estimated battery cell resistance and the estimated battery cell available energy in a memory.

A system for determining an estimated battery cell state-of-charge indicative of a state-of-charge of a battery cell and for determining an estimated resistance indicative of a resistance of a battery cell and for determining an estimated available energy indicative of an available energy of a battery cell in accordance with an exemplary embodiment is provided. The system includes a voltage sensor electrically coupled to the battery cell. The voltage sensor is configured to generate a first signal indicative of a battery cell voltage. The system further includes a current sensor electrically coupled to the battery cell. The current sensor is configured to generate a second signal indicative of a battery cell current. The system further includes a temperature sensor disposed proximate the battery cell. The temperature sensor is configured to generate a third signal indicative of battery cell temperature. The system further includes a computer configured to receive the first, second, and third signals. The computer is further configured to determine the estimated battery cell state-of-charge and the estimated battery cell resistance and the estimated battery cell available energy based on an adapted estimated polarization voltage vector and at least one of the first, second, and third signals. The computer is further configured to store values corresponding to the estimated battery cell state-of-charge and the estimated battery cell resistance and the estimated battery cell available energy in a memory.

A computer readable medium having computer-executable instructions for performing a method for determining an estimated battery cell state-of-charge indicative of a state-of-charge of a battery cell and for determining an estimated battery cell resistance indicative of a resistance of a battery cell and for determining an estimated battery cell available energy indicative of an available energy of a battery cell in accordance with an exemplary embodiment is provided. The method includes determining the estimated battery cell state-of-charge of the battery cell and the estimated battery cell resistance and the estimated battery cell available energy at a predetermined time based on an adapted estimated polarization voltage vector and at least one of a battery cell voltage, a battery cell current, and a battery cell temperature. The method further includes storing values corresponding to the estimated battery cell state-of-charge and the estimated battery cell resistance and the estimated battery cell available energy in a memory.

DETAILED DESCRIPTION OF THE INVENTION

Figure 1:
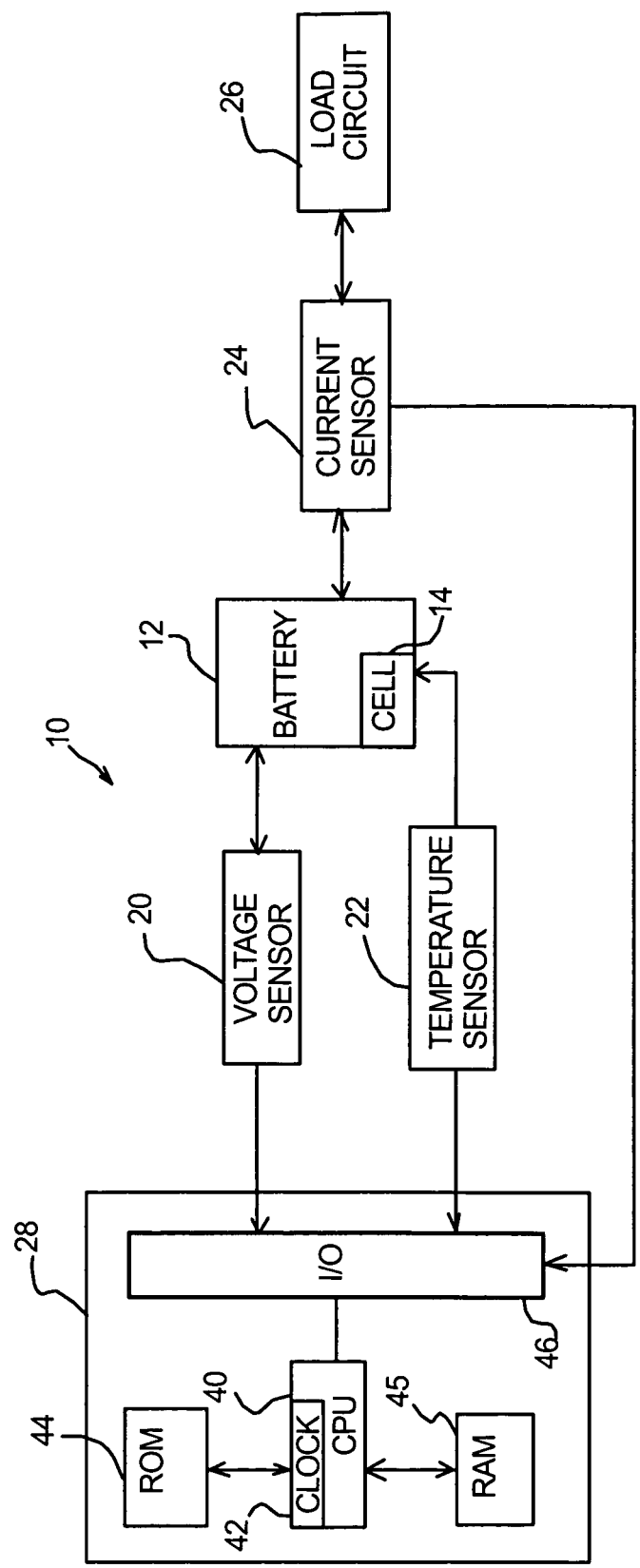
FIG. 1 is a schematic of a system for determining an estimated battery cell state-of-charge and available energy in accordance with an exemplary embodiment.

The state of an electrochemical cell, referred to herein as a battery cell, is defined as a set of values that may be used along with a mathematical description (called a "battery cell model") of battery cell electrochemical properties to predict its input-output characteristics at some point of time. For example, given a battery cell state and a battery cell current, one could predict a battery cell voltage. Alternately, given a battery cell state and a battery cell voltage, one could predict a battery cell current.

Values indicative of the state of a battery cell include (but are not limited to): state-of-charge, polarization voltages, hysteresis voltages, cell resistance, cell total capacity, polarization time constants, hysteresis levels, and an efficiency factor.

The battery cell state-of-charge (SOC) is a value between 0% and 100% that indicates the relative level of charge presently held by the battery cell. A state-of-charge of 100% corresponds to a "full" cell, while a state-of-charge of 0% corresponds to an "empty" cell. Battery cell SOC at time instant k is denoted as $z_k$ and evolves over time according to the equation $$z_k = z_{k-1} - \eta i_k \Delta t / C_n \qquad (1)$$

where $i_k$ is the battery cell current at time instant k, in amperes; $C_n$ is the battery cell nominal capacity, in ampere-hours; $\Delta t$ is the time interval between samples k−1 and k, in hours; and $\eta$ is a unitless efficiency factor, which may take on different values depending on whether the current is positive or negative. SOC itself is unitless. Note that in the convention used herein, discharge current is assumed to have positive sign and charge current is assumed to have negative sign. The opposite convention may be used with very simple changes to the equations, and the disclosed invention applies to that case as well.

The polarization voltages of a cell are values that model the non-instantaneous voltage changes that occur as electrical current is applied to the cell. These voltage changes evolve over time with specific time constants. There may be more than one time constant of cell voltage dynamics: one polarization voltage is associated with each time constant. The time constants are collectively stored in diagonal matrix $\alpha$, with one time constant in each diagonal entry. The polarization voltages are denoted by vector quantity $f_k$, which evolves over time according to the equation $$f_k = \alpha f_{k-1} + B i_{k-1} \qquad (2)$$

where B is a matrix that scales the battery cell current for addition to the polarization voltages.

The hysteresis voltage of a battery cell causes the resting voltage of a battery cell to depend not only on SOC but also on the recent history of battery cell current. If a given SOC level was reached by charging the cell to that point, the resting voltage is higher than if that SOC level was reached by discharging the cell to that point. A very simple hysteresis model is often sufficient for determining estimates of SOC and other battery cell operational parameters. Here, we propose a model of present hysteresis voltage being $M \, \text{sgn}(i_k)$, where M is the maximum hysteresis voltage (in volts), and the "sgn" function is equal to −1 if its argument is negative, 0 if its argument is zero, and +1 if its argument is positive.

Figure 2:
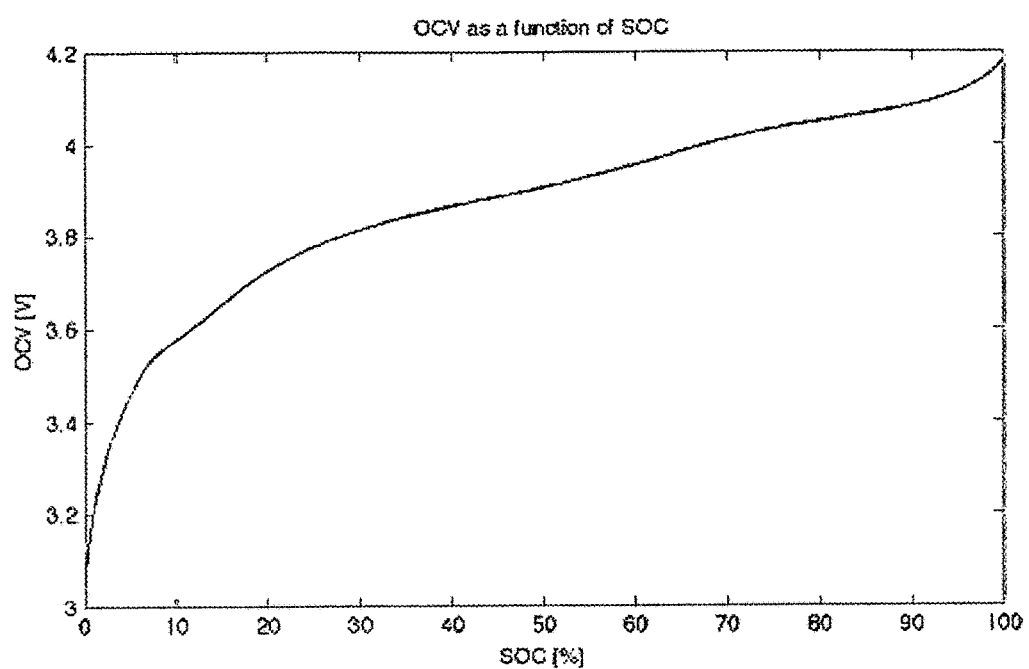
FIG. 2 is an exemplary plot of open-circuit-voltage as a function of state-of-charge.

The battery cell terminal voltage, possibly under load, is then modeled as $$v_k = OCV(z_k) - i_k R + C f_k + M \, \text{sgn}(i_k) \qquad (3)$$

where the "OCV" function computes the battery cell open-circuit-voltage (OCV) as a function of SOC (and may be computed using an algebraic expression or a table lookup, for example), the matrix C contains constant factors that when multiplied with $f_k$ compute a weighted sum of the polarization voltages, and R is the cell's Ohmic resistance (in Ohms). FIG. 2 displays a plot of an exemplary OCV function, $OCV(z_k)$.

Those skilled in the art of battery cell modeling will recognize that there are many other similar mathematical descriptions of the dynamics of a battery cell. These exemplary embodiments are not intended as a limitation of the invention being disclosed herein. Furthermore, the method may be applied to battery packs and modules comprising multiple cells, by either applying the method individually to each cell, or by scaling the equations so that the state-of-charge and resistance and available energy of multiple cells configured as modules is estimated together.

For many applications involving battery cells, it is important to have an estimate of the battery cell SOC. For other applications it is more important to have an estimate of battery cell remaining energy, which is a different but related quantity. For other applications it is furthermore important to have an estimate of battery cell resistance.

The current art takes three different approaches to SOC estimation. One simple approach is a battery-current based method, called "ampere-hour counting," which uses equation (1) along with measured current to dynamically update an SOC estimate. The problem with this method is that errors in the current-sensor reading, and errors in the estimate of nominal capacity will cause errors in the SOC estimate. Unless there is a correction mechanism in addition to the ampere-hour counting method, SOC estimates will tend to get worse and worse over time.

A second simple approach is a battery-voltage based method that takes the cell voltage under load and estimate the SOC as the inverse of the OCV function of that voltage: $z_k \approx OCV^{-1}(v_k)$. This estimate can be improved by including an Ohmic resistance term: $z_k \approx OCV^{-1}(v_k + i_k R)$. Both of these variants are very "noisy" and require significant low-pass filtering to get smooth estimates. Even then, the estimates tend to be biased.

A third approach, which gives excellent SOC estimation accuracy, is to employ complex algorithms such as Kalman filters, extended Kalman filters, or unscented/sigma-point Kalman filters (cf. U.S. Pat. Nos. 6,534,954, 7,400,115, and applications 20060100833, 20060111870, 20070046292, 20070103120, 20070188143, 20070236182). The Kalman filter is a battery-current based method with battery-voltage correction, which predicts a battery cell state vector which may include SOC as one of its components using a measurement of battery cell current, and then computes an updated corrected estimate of the battery cell state vector based on a measurement of a battery cell voltage. The process of computing an updated corrected estimate of the battery cell state vector requires computationally involved matrix arithmetic, which in turn requires an expensive processor, and may make it an unattractive approach for some applications.

Not all applications justify the complexity of the Kalman-filter based methods, but many applications can benefit from better SOC estimates than provided by the simple methods, which ignore significant contributing factors, at similar low level of computational complexity. Accordingly, we disclose herein a new method for estimating battery cell SOC that is primarily battery-voltage based, but with battery-current correction, which improves the accuracy of the battery-voltage based method without significantly increasing the complexity of the method. The present invention is computationally much simpler than Kalman filters, and is more accurate and robust than ampere-hour counting. It includes two effects not considered in a simple method before: the effect of polarization voltages and the effect of hysteresis. The inclusion of polarization voltages requires that these be estimated as well, and a simple adaptive method is presented to determine an adapted estimated polarization voltage vector. Additionally, the method may be used to estimate battery cell resistance and battery cell available energy.

In exemplary embodiments of the present invention, we assume that the OCV function, $\Delta t$, $\eta$, $C_n$, $\alpha$, B, R, C, and M are known values and functions, which may be time varying and temperature dependent. A temperature sensor may be used to measure the present battery cell temperature $T_k$ in order to determine the proper value for these parameters. Battery cell SOC is estimated, and battery cell energy may be estimated.

In additional exemplary embodiments of the present invention, we assume that the OCV function, $\Delta t$, $\eta$, $C_n$, $\alpha$, B, C, and M are known values and functions, which may be time varying and temperature dependent. A temperature sensor may be used to measure the present battery cell temperature $T_k$ in order to determine the proper value for these parameters. Battery cell SOC and resistance are estimated, and battery cell energy may be estimated.

An overview of the method for estimating a battery cell state-of-charge will now be described. Referring to FIG. 1, the computer 28 computes an adapted estimated polarization voltage vector. The system 10 measures a battery cell voltage, a battery cell current, and a battery cell temperature. The computer 28 determines the estimated battery cell state-of-charge of the battery cell and the estimated battery cell resistance and the estimated battery cell available energy of the battery cell based on an adapted estimated polarization voltage vector and at least one of the battery cell voltage, the battery cell current, and the battery cell temperature. Further, the computer 28 stores the estimated battery cell state-of-charge and the estimated battery cell resistance and the estimated battery cell available energy in the memory 45.

In one exemplary embodiment, the estimated battery cell state-of-charge is desired, and the battery cell resistance is assumed known. We first design an adaptive recursive estimator of the polarization voltages $f_k$. We denote the adapted estimated polarization voltage vector by $\hat{f}_k$, and compute the estimate by the equations $$\hat{v}_{k-1} = OCV(\hat{z}_{k-1}) - i_{k-1}R + C\hat{f}_{k-1} + M\operatorname{sgn}(i_{k-1}) \qquad (4)$$

$$\hat{f}_k = \alpha \hat{f}_{k-1} + Bi_{k-1} + L(v_{k-1} - \hat{v}_{k-1})$$

were $\hat{z}_k$ is an estimate of state-of-charge at time k, $\hat{v}_k$ is an estimate of cell terminal voltage $v_k$ at time k, and L is a vector of constants designed to blend the voltage estimation error into the polarization voltage estimate to cause it to converge rapidly to its correct value, despite any initial estimation error. Those skilled in the art of adaptive observer design will recognize that a number of methods may be used to design L, including but not limited to the Ackermann and the Bass-Gura methods.

An initial state-of-charge estimate $\hat{z}_k^{(i)}$ is then computed by the relationship $$\hat{z}_k^{(i)} = OCV^{-1}(v_k + i_k R - C\hat{f}_k - M\operatorname{sgn}(i_k)). \qquad (5)$$

Figure 3:
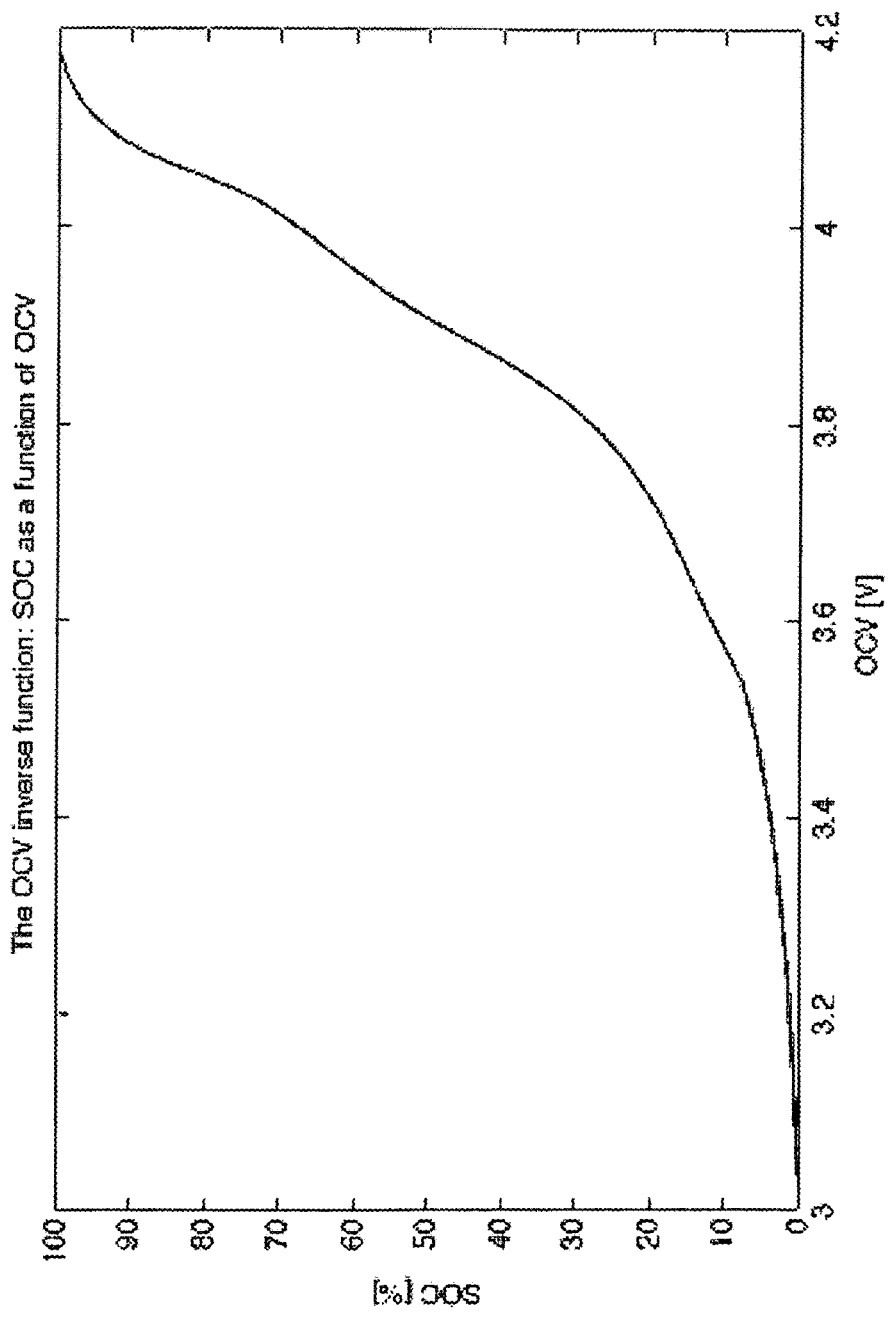
FIG. 3 is an exemplary plot of the inverse open-circuit-voltage function.

The $OCV^{-1}$ function is the inverse relationship of the OCV function (and may be computed using an algebraic expression or a table lookup, for example). FIG. 3 displays a plot of an exemplary $OCV^{-1}$ function, corresponding to the OCV function of FIG. 2. Note that (5) improves on the simple methods by accounting for the effects of polarization voltage and hysteresis. This has the result of removing to a great extent the bias in the estimate and reducing the noise level in the estimate.

A filtered SOC estimate is then computed.

$$\hat{z}_k^{(f)} = \sum_{j=0}^{n_b} b_j \hat{z}_{k-j}^{(i)} + \sum_{j=1}^{n_a} a_j \hat{z}_{k-j}^{(f)} \qquad (6)$$

where $a_j$, $j=1 \, L \, n_a$, and $b_j$, $j=1 \, L \, n_b$, are constants designed to implement a smoothing filter. A result of the smoothing filter is that the filtered SOC estimate is delayed with respect to the true SOC, which can be accounted for via computing the estimated battery cell state-of-charge to be $$\hat{z}_k = \hat{z}_k^{(f)} - \sum_{j=0}^{n_T} i_{k-j} \Delta t / C_n \qquad (7)$$

where $n_T$ is the number of delayed samples that must be accounted for.

The algorithm may be initialized by computing $$\hat{z}_m = \hat{z}_m^{(f)} = \hat{z}_m^{(i)} = OCV^{-1}(v_0) \qquad (8)$$

for $m \leq 0$, and by assuming $i_m = 0$ for $m \leq 0$ and $\hat{f}_m = 0$ for $m \leq 0$.

In a second exemplary embodiment, an estimated battery cell available energy is further required. This estimated battery cell available energy may then be computed as $$\text{Estimated battery cell available energy} = C_n \int_0^{\hat{z}_k} OCV(z) dz \qquad (9)$$

Figure 4:
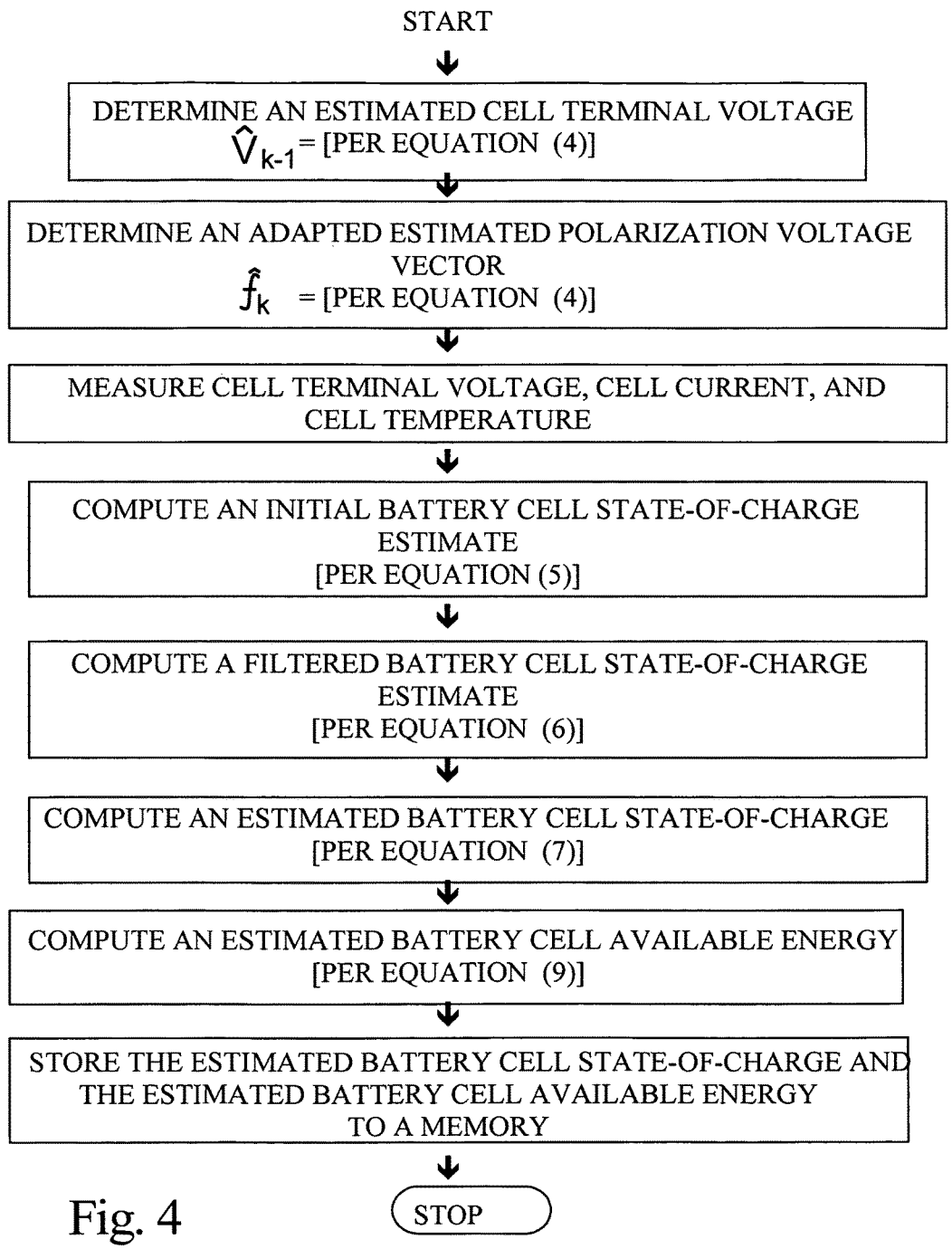
FIG. 4 is a block diagram of an exemplary computational algorithm utilized by the system of FIG. 1.

The integral may be computed using algebraic equations, or via table lookup into a table of pre-integrated OCV versus SOC. The method summarizing these two exemplary embodiments is charted in FIG. 4.

In a third exemplary embodiment, both the estimated battery cell state-of-charge and the estimated battery cell resistance are desired. We denote the estimate of battery cell resistance at time index k by $\hat{R}_k$. We again first design an adaptive recursive estimator of the polarization voltages:

$$\hat{v}_{k-1} = OCV(\hat{z}_{k-1}) - i_{k-1}\hat{R}_{k-1} + C\hat{f}_{k-1} + M\operatorname{sgn}(i_{k-1}) \qquad (10)$$

$$\hat{f}_k = \alpha \hat{f}_{k-1} + Bi_{k-1} + L(v_{k-1} - \hat{v}_{k-1}).$$

An initial state-of-charge estimate is then computed by the relationship $$\hat{z}_k^{(i)} = OCV^{-1}(v_k + i_k \hat{R}_{k-1} - C\hat{f}_k - M\operatorname{sgn}(i_k)). \qquad (11)$$

A filtered SOC estimate is then computed:

$$\hat{z}_k^{(f)} = \sum_{j=0}^{n_b} b_j \hat{z}_{k-j}^{(i)} + \sum_{j=1}^{n_a} a_j \hat{z}_{k-j}^{(f)}, \qquad (12)$$

where $a_j$, $j=1 \, L \, n_a$, and $b_1$, $j=1 \, L \, n_b$, are constants designed to implement a smoothing filter. A result of the smoothing filter is that the filtered SOC estimate is delayed with respect to the true SOC, which can be accounted for via computing the estimated battery cell state-of-charge to be $$\hat{z}_k = \hat{z}_k^{(f)} - \sum_{j=0}^{n_r} i_{k-j} \Delta t / C_n \quad (13)$$

where $n_r$ is the number of delayed samples that must be accounted for.

An initial resistance estimate $\hat{R}_k^{(i)}$ is then computed. If $|i_k - i_{k-1}|$ is greater than some threshold value, then $$\hat{R}_k^{(i)} = \frac{v_{k-1} - v_k + M(\text{sgn}(i_k) - \text{sgn}(i_{k-1}))}{i_k - i_{k-1}}. \quad (14)$$

Otherwise, $\hat{R}_k^{(i)} = \hat{R}_{k-1}^{(i)}$. An estimated battery cell resistance is then computed by filtering the initial resistance estimates $$\hat{R}_k = \sum_{j=0}^{n_d} d_j \hat{R}_{k-j}^{(i)} + \sum_{j=1}^{n_c} c_j \hat{R}_{k-j} \quad (15)$$

where $c_j$, j=1 L $n_c$, and $d_j$, j=1 L $n_d$, are constants designed to implement a smoothing filter.

The algorithm may be initialized by computing $$\hat{z}_m = \hat{z}_m^{(f)} = \hat{z}_m^{(i)} = OCV^{-1}(v_0) \text{ and } \hat{R}_m = \hat{R}_m^{(i)} = R \quad (16)$$

for m≤0, and by assuming $i_m$=0 form m≤0 and $\hat{f}_m$=0 for m≤0, and R is the design resistance for the cell.

In a fourth exemplary embodiment, an estimated battery cell available energy is further required. This estimated battery cell available energy may then be computed as $$\text{Estimated battery cell available energy} = C_n \int_0^{\hat{z}_k} OCV(z) dz \quad (17)$$

Figure 5A:
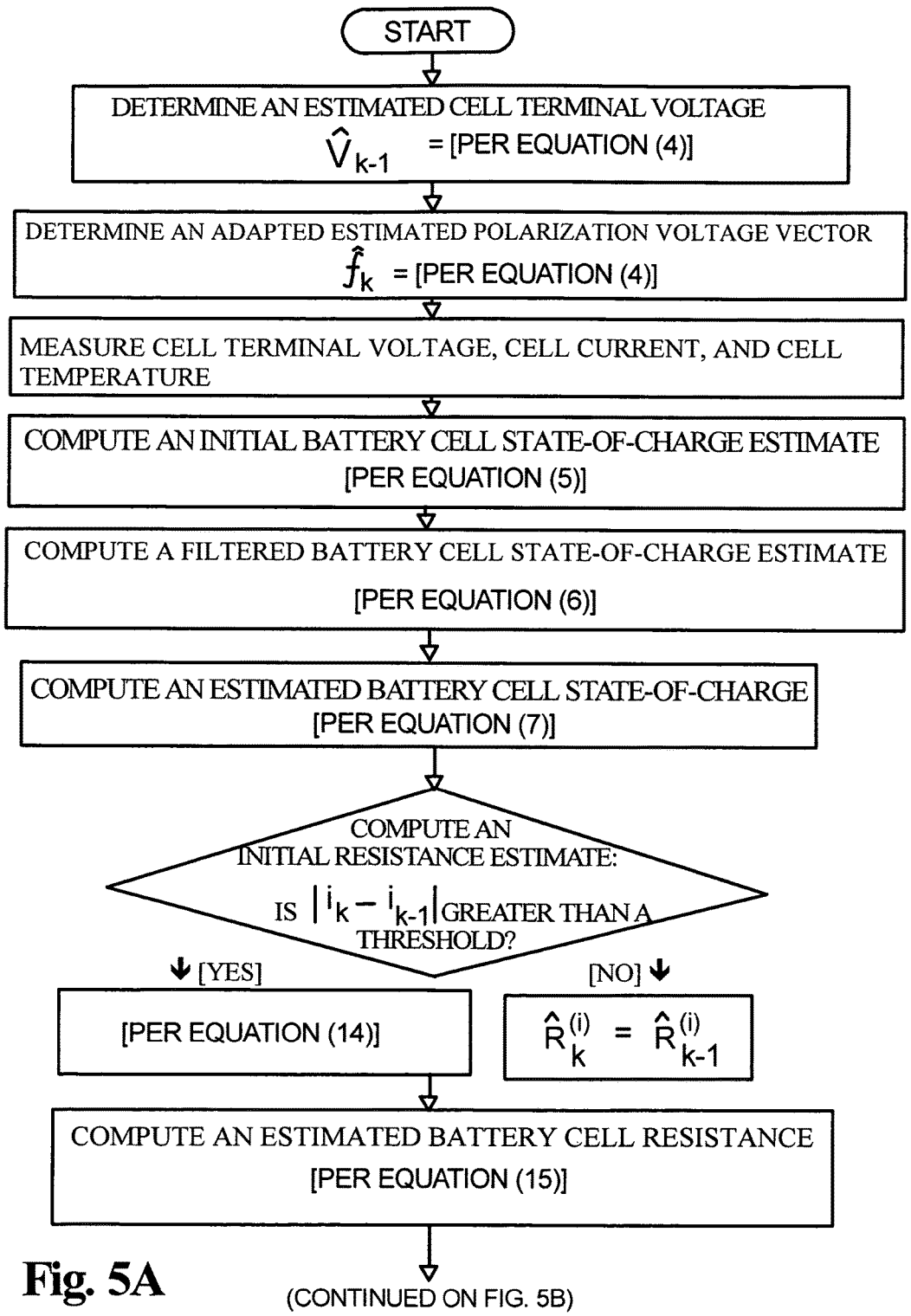
FIG. 5A is a block diagram of an exemplary computational algorithm utilized by the system of FIG. 1, which is continued on FIG. 5B
Figure 5B:
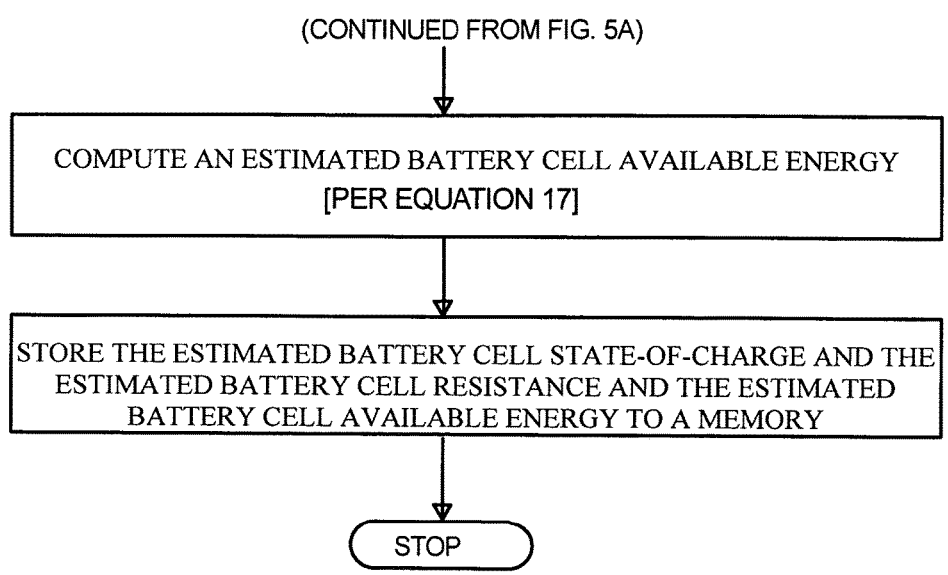
FIG. 5B is a continuation of the block diagram of FIG. 5A, which is an exemplary computational algorithm utilized by the system of FIG. 1.

The integral may be computed using algebraic equations, or via table lookup into a table of pre-integrated OCV versus SOC. The method summarizing the third and fourth exemplary embodiments is charted in FIGS. 5A and 5B.

Figure 6:
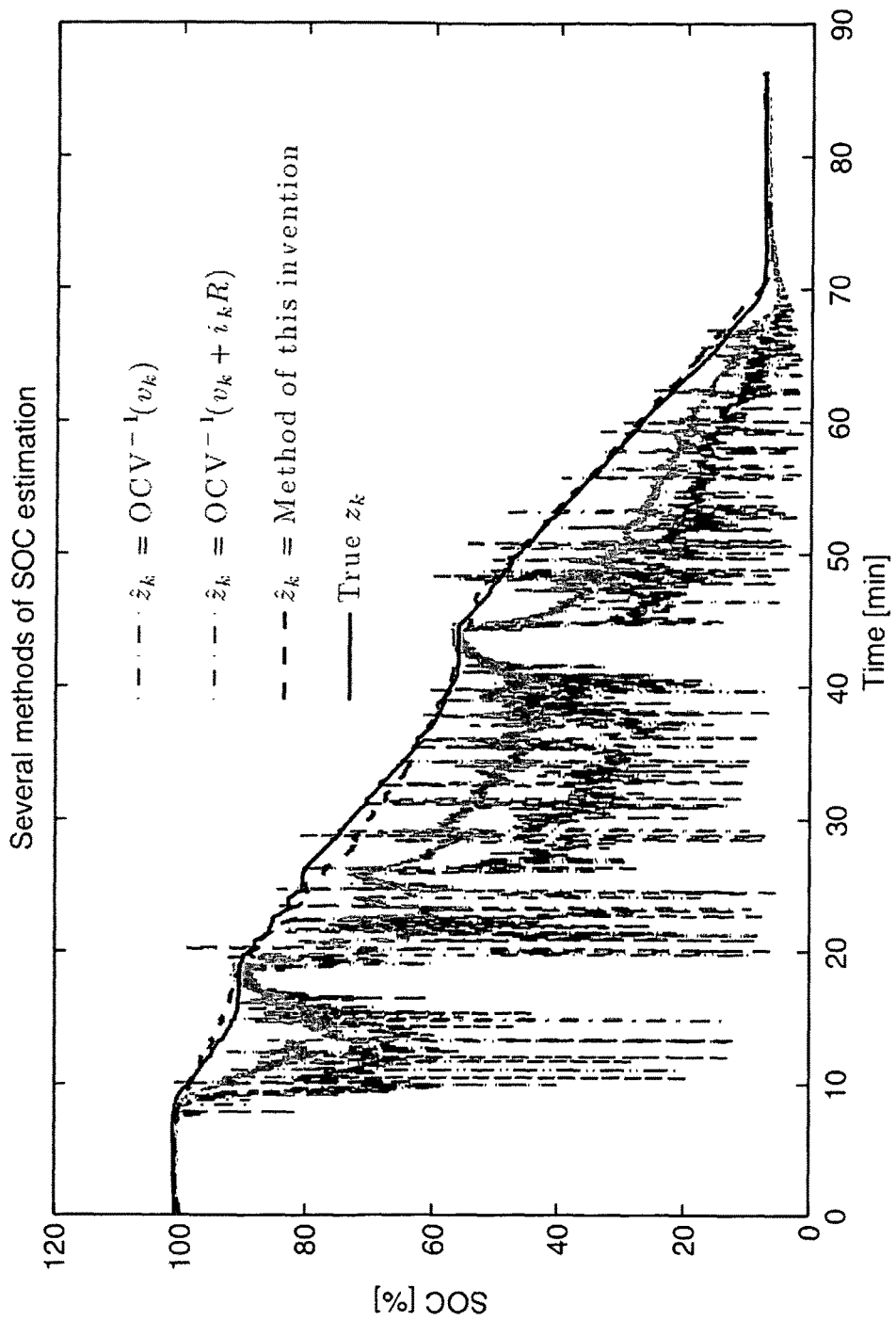
FIG. 6 is an experimental result comparing the method of the system of FIG. 1 with other methods used in present art.

FIG. 6 displays some results of the disclosed method. True SOC versus time is plotted for a cell whose current is a very dynamic function of time. The cell begins the test fully charged, and completes the test with about 9% charge remaining. Three different estimates of SOC are plotted, along with the true cell SOC. The lightest gray line simply uses the cell terminal voltage when computing an SOC estimate. The medium gray line uses the cell terminal voltage, modified to account for Ohmic resistance, when computing an SOC estimate. The dark dashed line is the SOC estimate produced by the present invention, and the solid dark line is the true SOC. We see that the first two methods produce results that are both noisy and biased. The present invention produces very smooth results that are not biased, and are particularly accurate at both high and low levels of cell SOC.

The system and method for determining an estimated battery cell state-of-charge and an estimated battery cell resistance and an estimated battery cell available energy provides a substantial advantage over other systems and methods. In particular, the system and method provide a technical effect of accurately determining an estimated battery cell state-of-charge and an estimated battery cell resistance and an estimated battery cell available energy that is computationally efficient to compute.

The above-described methods can be embodied in the form of computer program code containing instructions embodied in tangible media, such as floppy diskettes, CD ROMs, hard drives, or any other computer-readable storage medium, wherein, when the computer program code is loaded into and executed by a computer, the computer becomes an apparatus for practicing the invention. The above-described methods can also be embodied in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes an apparatus for practicing the methods. When implemented on a general-purpose microprocessor, the computer program code segments configure the microprocessor to create specific logic circuits.

While the invention is described with reference to an exemplary embodiment, it will be understood by those skilled in the art that various changes may be made and equivalent elements may be substituted for elements thereof without departing from the scope of the invention. In addition, many modifications may be made to the teachings of the invention to adapt to a particular situation without departing from the scope thereof. Therefore, it is intended that the invention not be limited the embodiments disclosed herein, but that the invention includes all embodiments falling with the scope of the appended claims. Moreover, the use of the terms first, second, etc. does not denote any order of importance, but rather the terms first, second, etc. are used to distinguish one element from another.

What is claimed is:

1. A method for dynamically determining an estimated battery cell state-of-charge indicative of a state-of-charge of a battery cell, comprising:
    determining, via a processor, an adapted estimated polarization voltage vector corresponding to battery cell polarization voltages at a first time based at least in part on a difference between a measured cell terminal voltage and an estimated cell terminal voltage at a second time prior to the first time;
    measuring, via one or more sensors, at least one of a battery cell voltage, a battery cell current, and a battery cell temperature at the first time;
    determining, via the processor, the estimated battery cell state-of-charge based on the adapted estimated polarization voltage vector, and at least one of the battery cell voltage, the battery cell current, and the battery cell temperature measured at the first time; and
    storing, at the processor, a value corresponding to the estimated battery cell state-of-charge at the first time in a memory.

2. The method of claim 1, wherein determining the adapted estimated polarization voltage vector corresponding to the battery cell polarization voltages at the first time comprises:
    determining the estimated cell terminal voltage corresponding to the second time, the estimated cell terminal voltage corresponding to the second time being based on at least an estimated battery cell state-of-charge at the second time, an adapted estimated polarization voltage vector at the second time, and a battery cell current at the second time;

determining the difference between the measured battery cell voltage at the second time and the estimated cell terminal voltage corresponding to the second time; and determining the adapted estimated polarization voltage vector corresponding to the first time, based on the adapted estimated polarization voltage vector corresponding to the second time, the battery cell current at the second time, and the voltage difference.

3. The method of claim 1, wherein determining the estimated battery cell state-of-charge further comprises:

determining an initial battery cell state-of-charge estimate based on the measured battery cell voltage, the measured cell current, and the adapted estimated polarization voltage vector at the first time;

determining a filtered battery cell state-of-charge estimate based on at least one of an initial battery cell state-of-charge estimate corresponding to a present or prior time and a filtered battery cell state-of-charge estimate corresponding to a prior time; and determining an estimated battery cell state-of-charge based on the filtered battery cell state-of-charge and at least one present or prior measured cell current.

4. The method of claim 1, further comprising determining an estimated battery cell available energy based on the estimated battery cell state-of-charge, a value from an integrated battery cell open-circuit-voltage relationship, and a battery cell capacity value.

5. A method for dynamically jointly determining an estimated battery cell state-of-charge indicative of a state-of-charge of a battery cell and an estimated battery cell resistance indicative of a resistance of a battery cell, the method comprising:

determining, via a processor, an adapted recursive estimated polarization voltage vector corresponding to battery cell polarization voltages based at least in part on a difference between a measured cell terminal voltage and an estimated cell terminal voltage;

measuring, via one or more sensors, at least one of a battery cell voltage, a battery cell current, and a battery cell temperature;

determining, via the processor, the estimated battery cell state-of-charge based on the adapted estimated polarization voltage vector, and the at least one of the battery cell voltage, the battery cell current, and the battery cell temperature; and determining, via the processor, the estimated battery cell resistance based on the battery cell voltage, the battery cell current, and at least one prior battery cell voltage and one prior battery cell current.

6. The method of claim 5, wherein the step of determining the adapted estimated polarization voltage vector corresponding to the battery cell polarization voltages at a first time comprises:

determining the estimated cell terminal voltage corresponding to a second time, the second time being prior to the first time, the estimated cell terminal voltage corresponding to the second time being based on at least an estimated battery cell state-of-charge at the second time, an adapted estimated polarization voltage vector at the second time, and a after battery cell current at the second time;

determining the voltage difference between the measured battery cell voltage at the second time and the estimated cell terminal voltage corresponding to the second time; and determining the adapted estimated polarization voltage vector corresponding to the first time, based on the adapted estimated polarization voltage vector corresponding to the second time, the battery cell current at the second time, and the voltage difference.

7. The method of claim 5, wherein the step of determining the estimated battery cell state-of-charge comprises:

determining an initial battery cell state-of-charge estimate based on the measured battery cell voltage, the measured cell current, and the adapted estimated polarization voltage vector;

determining a filtered battery cell state-of-charge estimate based on at least one of an initial battery cell state-of-charge estimate corresponding to a present or prior time and a filtered battery cell state-of-charge estimate corresponding to a prior time; and determining an estimated battery cell state-of-charge base on the filtered battery state-of-charge and at least one present or prior measured cell current.

8. The method of claim 5, further comprising determining an estimated battery cell available energy based on the estimated battery cell state-of-charge, a value from an integrated battery cell open-circuit-voltage relationship, and a battery cell capacity value.

9. The method of claim 5, wherein determining the estimated battery cell resistance based on the battery cell voltage, the battery cell current, and at least one prior battery cell voltage and one prior battery cell current comprises computing an initial resistance estimate based on a present battery cell voltage, a prior battery cell voltage, a present battery cell current, and a prior battery cell current;

determining the estimated battery cell resistance based on at least one of an initial resistance estimate corresponding to a present or prior time and an estimated battery cell resistance corresponding to a prior time.

10. A system for dynamically determining an estimated battery cell state-of-charge indicative of a state-of-charge of a battery cell, the system comprising:

a voltage sensor electrically coupled to the battery cell, the voltage sensor configured to generate a first signal, the first signal being indicative of a battery cell voltage;

a current sensor electrically coupled to the battery cell, the current sensor configured to generate a second signal, the second signal being indicative of a battery cell current;

a temperature sensor disposed proximate to the battery cell, the temperature sensor configured to generate a third signal, the third signal being indicative of battery cell temperature; and a computer configured to receive the first, second, and third signals, and to determine the estimated battery cell state-of-charge at a predetermined time based on an adapted estimated polarization voltage vector and at least one of the first, second, and third signals, the adapted estimated polarization voltage vector corresponding to battery cell polarization voltages and being determined based at least in part on a difference between a measured cell terminal voltage and an estimated cell terminal voltage.

11. The system of claim 10, wherein the computer is further configured to determine an estimated battery cell available energy based on the estimated battery cell stateof-charge, a value from an integrated battery cell open-circuit-voltage relationship, and a battery cell capacity value.

12. A non-transitory computer-readable medium having computer-readable instructions for performing a method for dynamically determining an estimated battery cell state-of-charge indicative of a state-of-charge of a battery cell, the instructions causes a computer, when executed the instructions, to perform the method, the method comprising:

determining the estimated battery cell state-of-charge based on an adapted estimated polarization voltage vector, and at least one of a battery cell voltage, a battery cell current, and a battery cell temperature, the adapted estimated polarization voltage vector corresponding to battery cell polarization voltages and being determined based at least in part on a difference between a measured cell terminal voltage and an estimated cell terminal voltage; and storing a value corresponding to the estimated battery cell state-of-charge in a memory.

* * * * *